United States Patent
Jung et al.

(10) Patent No.: US 9,432,022 B2
(45) Date of Patent: Aug. 30, 2016

(54) WIDE-RANGE LEVEL-SHIFTER

(71) Applicant: QUALCOMM Incorporated, San Diego, CA (US)

(72) Inventors: Changho Jung, San Diego, CA (US); Frank Guo, Danville, CA (US); Rakesh Vattikonda, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 17 days.

(21) Appl. No.: 14/257,212

(22) Filed: Apr. 21, 2014

(65) Prior Publication Data

US 2015/0303921 A1    Oct. 22, 2015

(51) Int. Cl.
*H03L 5/00* (2006.01)
*H03K 19/0185* (2006.01)
*H03K 3/356* (2006.01)

(52) U.S. Cl.
CPC ...... *H03K 19/018521* (2013.01); *H03K 3/356182* (2013.01)

(58) Field of Classification Search
None
See application file for complete search history.

(56) References Cited

U.S. PATENT DOCUMENTS

| | | | |
|---|---|---|---|
| 6,351,173 B1* | 2/2002 | Ovens et al. | 327/333 |
| 7,456,676 B2* | 11/2008 | Sohn | 327/333 |
| 7,710,183 B2 | 5/2010 | Chaba et al. | |
| 8,319,540 B2 | 11/2012 | Barrow | |
| 8,368,425 B2* | 2/2013 | Huang | 326/81 |
| 8,400,206 B2 | 3/2013 | Benzer | |
| 8,421,518 B2 | 4/2013 | Larsen | |
| 8,610,462 B1 | 12/2013 | Wang et al. | |
| 2013/0021085 A1* | 1/2013 | Kumar et al. | 327/333 |
| 2013/0257505 A1* | 10/2013 | Chiang | 327/333 |
| 2013/0265094 A1* | 10/2013 | Sinha et al. | 327/333 |
| 2013/0300486 A1* | 11/2013 | Kumar | 327/333 |
| 2015/0070069 A1* | 3/2015 | Kossel et al. | 327/333 |
| 2015/0078096 A1* | 3/2015 | Kawasaki | 365/185.23 |

FOREIGN PATENT DOCUMENTS

| | | | | |
|---|---|---|---|---|
| EP | 1126612 A1 | 8/2001 | | |
| JP | EP 1126612 A1 * | 8/2001 | ....... | H03K 3/356113 |
| KR | 20070068230 A | 6/2007 | | |

OTHER PUBLICATIONS

Partial International Search Report—PCT/US2015/020217—ISA/EPO—Jun. 1, 2015.
International Search Report and Written Opinion—PCT/US2015/020217—ISA/EPO—Aug. 6, 2015.

\* cited by examiner

*Primary Examiner* — Lincoln Donovan
*Assistant Examiner* — Khareem E Almo
(74) *Attorney, Agent, or Firm* — Haynes and Boone, LLP (57) ABSTRACT

A level-shifter is provided with PMOS stacks that are selectively weakened or strengthened depending upon the binary state of an input signal.

19 Claims, 6 Drawing Sheets

WIDE-RANGE LEVEL-SHIFTER

TECHNICAL FIELD

This application relates to level-shifters, and more particularly to a wide-range level-shifter.

BACKGROUND

Figure 1:
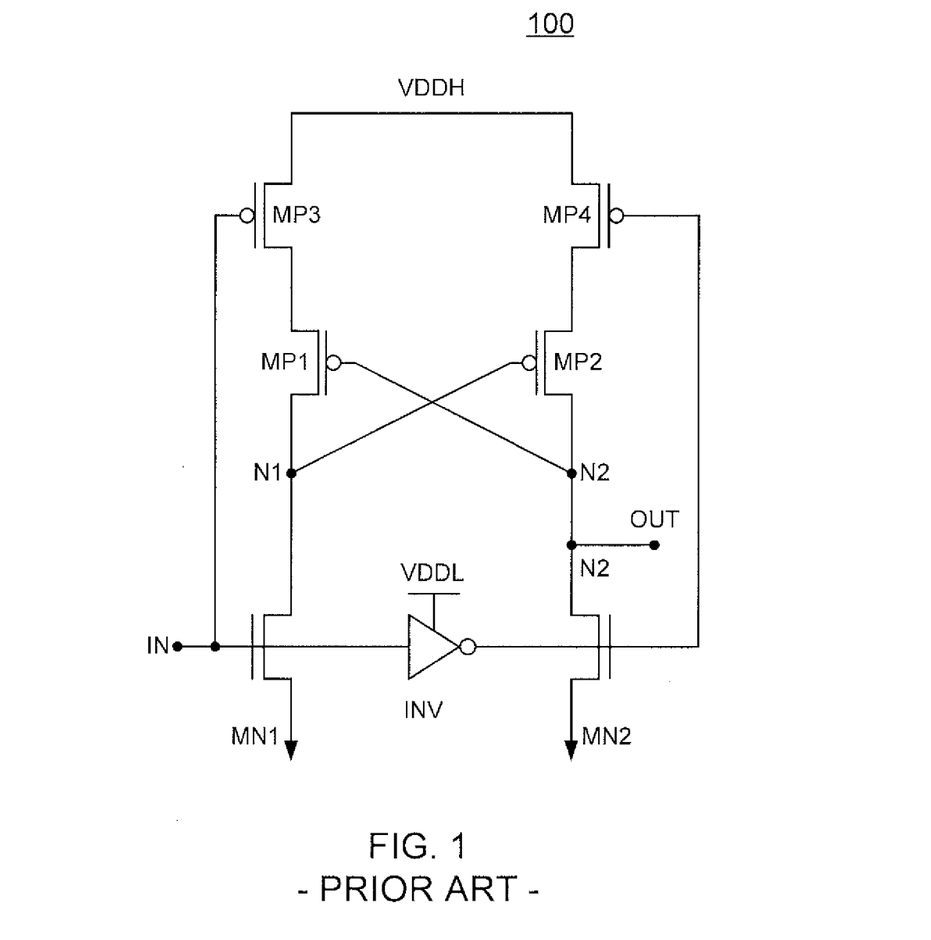
FIG. 1 is a circuit diagram of a conventional level-shifter.

As semiconductor technology has advanced into the deep submicron regime, the power supply, voltage is scaled down in concert with the scaling down of transistor dimensions. For example, microprocessors are now manufactured with transistors powered by a sub-one volt power supply voltage. But these modern systems may need to interface with peripheral devices such as memories that operate on higher supply voltages. The signal flow from the low-voltage domain to the high-voltage domain requires a shift up in voltage. Conversely, the signal flow from the high-voltage domain to the low-voltage domain requires a shift down in voltage. A conventional level-shifter 100 is shown in FIG. 1 that may perform such voltage level shifts between an input signal (IN) and an output signal (OUT). In this embodiment, the input signal is a low-voltage-domain (VDDL) signal whereas the output signal is a high-voltage-domain (VDDH) signal. However, level-shifter 100 is readily modified to instead shift down in voltage.

The input signal drives a gate of an NMOS transistor MN1. If the input signal is low (ground or VSS), transistor MN1 switches off, allowing a node N1 to float. The input signal also drives an inverter INV that produces an inverted input signal that in turn drives a gate of an NMOS transistor MN2. Inverter INV is powered by a power supply node providing the low-voltage-domain power supply voltage VDDL. Thus, inverter INV will charge the gate of transistor MN2 to VDDL when the input signal is low, which switches on transistor MN2 to pull node N2 to ground.

Node N2 couples to a gate of a PMOS transistor MP1 that has its drain coupled to node N1. Transistor MP1 is cross-coupled with a PMOS transistor MP2. The input signal also drives a gate of a PMOS transistor MP3 in series with transistor MP1. When the input signal is low, both transistors MP3 and MP1 will be on, which charges node N1 to a high-voltage-domain power supply voltage VDDH. Node N1 drives the gate of transistor MP2 coupled to node N2. Transistor MP2 will thus be off when the input signal is low. Another PMOS transistor MP4 that has its gate driven by the inverted input signal is in series with transistor MP3.

In response to the input signal switching high to VDDL, transistor MN1 will switch on and transistor MN2 will switch off. Output node N2, which had been discharged while the input signal was low, must then float until transistor MP2 can be switched on. In turn, transistor MP2 can't switch on until transistor MN1 can discharge node N1. However, transistor MP1 is still momentarily on and attempting to keep node N1 charged, which thus fights with transistor MN1 discharging node N1. Transistor MP3 is only weakly on because VDDL is effectively a weak zero with regard to VDDH. Transistor MP3 thus assists transistor MN1 in terms of discharging node N1 by restricting the flow of charge to transistor MP1. Once node N1 is discharged, transistor MP2 will switch on. Since transistor MP4 will already be on due to the inverted input signal being driven low, the switching on of transistor MP2 will charge the output signal to VDDH. An analogous struggle occurs between transistors MN2 and MP2 when the inverted signal is driven to VDDL in response to the input signal transitioning low.

This fight between the NMOS and PMOS transistors in level-shifter 100 may be alleviated by weakening PMOS transistors MP3 and MP1 (as well as transistors MP4 and MP2). But such a weakening adversely affects timing as each PMOS stack MP3/MP1 and MP4/MP2 must also pull up its corresponding node (N1 or N2, respectively) depending upon whether the input signal is high or low. There is thus a minimum amount of strength necessary for the PMOS stacks to meet desired timing requirements. Since the PMOS stacks must be left relatively strong, there is a limit to the voltage range for level-shifter 100. In that regard, as VDDL drops ever lower at the modern process nodes, transistor MP3 turns on ever stronger with regard to VDDL functioning as an effective zero in keeping transistor MP3 on despite the input signal transitioning high to VDDL. This input range for level-shifter 100 is also affected by the process corner. Should level-shifter 100 be manufactured in a process corner that makes NMOS transistors relatively weak compared to the corresponding PMOS transistors, the PMOS/NMOS struggle with regard to discharging node N1 is aggravated.

Accordingly, there is a need in the art for level-shifters with improved input voltage range and operating speed.

SUMMARY

A level-shifter is provided that includes a pair of cross-coupled PMOS transistors. The level-shifter also includes two PMOS transistor stacks. A first PMOS stack includes a first one of the cross-coupled PMOS transistors and a second one of the stacks includes a second one of the cross-coupled PMOS transistors.

The first PMOS stack includes a first weak PMOS keeper transistor that has its gate driven by an input signal and is coupled in parallel with a first PMOS pull-up transistor that is relatively strong in comparison to the first weak keeper transistor. The level-shifter includes a control circuit that controls whether the first pull-up transistor is switched on or off. The second PMOS stack is analogous to the first PMOS stack. In that regard, the second PMOS stack includes a second weak keeper PMOS transistor that has its gate driven by an inverted version of the input signal and is coupled in parallel with a second pull-up PMOS transistor that is relatively strong with respect to the second weak keeper transistor. The control circuit also controls whether the second pull-up transistor is switched on or off.

The control circuit controls the first pull-up transistor to be switched on when the first PMOS stack functions to charge a first node to a first power supply voltage in response to the input signal transitioning from a second power supply voltage to ground. Conversely, the control circuit controls the first pull-up transistor to be switched off when the first node is discharged in response to the input signal transitioning from ground to the second power supply voltage. In this fashion, the level-shifter has the advantage of a weak first PMOS stack with regard to discharging the first node yet has the advantage of a strong first PMOS stack with regard to charging the first node to the first power supply voltage. The second power supply voltage may be less than or greater than the first power supply voltage.

The control circuit also controls the second pull-up transistor to be switched on when the second PMOS stack functions to charge a second node to the first power supply voltage in response to the input signal transitioning from ground to the second power supply voltage. Conversely, the control circuit controls the second pull-up transistor to be switched off when the second node is discharged in response to the input signal transitioning from the second power supply voltage to ground. In this fashion, the level-shifter has the advantage of a weak second PMOS stack with regard to discharging the second node yet has the advantage of a strong second PMOS stack with regard to charging the second node to the first power supply voltage. These advantageous features may be better appreciated with reference to the following detailed description.

BRIEF DESCRIPTION OF THE DRAWINGS

Embodiments of the disclosed level-shifter and their advantages are best understood by referring to the detailed description that follows. It should be appreciated that like reference numerals are used to identify like elements illustrated in one or more of the figures.

DETAILED DESCRIPTION

A level-shifter is provided that offers a PMOS stack that is selectively weakened with regard to an NMOS transistor pulling an internal node low with regard to a first binary transition in the input signal. The PMOS stack is also selectively strengthened when the PMOS stack must charge the internal node high with regard to a complementary second binary transition of the input signal.

Figure 2:
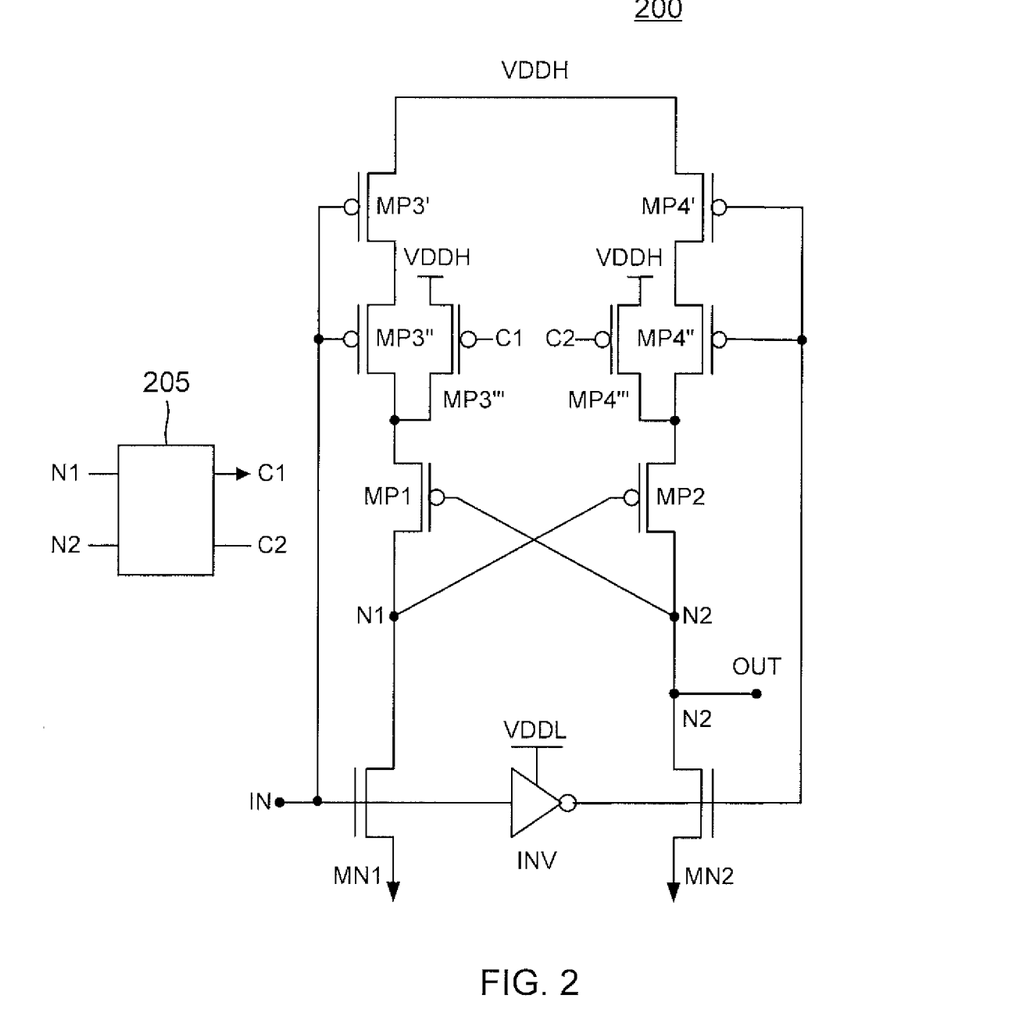
FIG. 2 is a high-level circuit diagram of a wide-range level-shifter in accordance with an embodiment of the disclosure.

This selective weakening and strengthening of the PMOS stacks may be better understood with reference to the level-shifter 200 shown in FIG. 2. Transistors MN1, MN2, MP1, and MP2 as well as inverter INV operate as discussed with regard to level-shifter 100. Their operation will be reviewed again for additional clarity.

The input signal (IN) supplied on an input signal node that drives the gate of NMOS transistor MN1, which has its source coupled to ground and its drain coupled to node N1. If the input signal is low (ground or VSS), transistor MN1 switches off, allowing node N1 to float. The input signal also drives an inverter INV that in turn drives a gate of an NMOS transistor MN2 with an inverted version of the input signal. Transistor MN2 has its source coupled to ground and its drain coupled to node N2 that supplies the output signal. Inverter INV is powered by a power supply node providing the low-voltage-domain power supply voltage VDDL. Thus, inverter INV will charge the gate of transistor MN2 to VDDL when the input signal is low, which switches on transistor MN2 to pull node N2 to ground. Conversely, when the input signal is high (VDDL), transistor MN1 will switch on to pull node N1 to ground and transistor MN2 will switch off, allowing node N2 to float.

PMOS transistors MP1 and MP2 are cross-coupled with regard to their drains and gates. The drain of transistor MP1 couples to node N1 that also couples to the gate of transistor MP2. Similarly, the drain of transistor MP2 couples to node N2 that also couples to the gate of transistor MP1. When node N1 is discharged, transistor MP2 will thus switch on. Conversely, transistor MP1 switches on responsive to node N2 discharging to ground. Transistors MP1 and MP2 are each part of a corresponding PMOS stack. In level-shifter 100, transistor MP1 was part of a PMOS stack that also included transistor MP3. However, transistor MP3 of level-shifter 100 is replaced by PMOS transistors MP3', MP3", and MP3''' in level-shifter 200. Similarly, transistor MP2 was part of a PMOS stack that also included transistor MP4. This transistor MP4 of level-shifter 100 is replaced by transistors MP4', MP4", and MP4''' in level-shifter 200.

With regard to the transistor MP1 PMOS stack, transistors MP3' and MP3" are in series between a power supply node providing VDDH and a source for transistor MP1. The source of transistor MP3' couples to a power supply node providing VDDH and its drain couples to a source for transistor MP3". The drain of transistor MP3" couples to a source of transistor MP1. The input signal drives the gates of transistors MP3' and MP3" analogously to how the input signal drives the gate of transistor MP3 in level-shifter 100. Both transistors MP3' and MP3" are relatively weak in comparison to transistor MP1, which is relatively strong in comparison to transistors MP3' and MP3". By being coupled in series, transistors MP3' and MP3" are the equivalent of a single, even weaker PMOS transistor. Recall that one solution to extending the voltage range of level-shifter 100 was to weaken transistor MP3. Transistors MP3' and MP3" thus function as this desirable weakening of transistor MP3 to prevent the node N1 discharge struggle discussed with regard to level-shifter 100. Despite this PMOS stack weakening, level-shifter 200 does not suffer the delays that would vex operation of level-shifter 100 if its transistor MP3 were weakened to increase its input voltage range as will be explained further herein with regard to the operation of transistor MP3'.

Given the weakness of transistors MP3' and MP3", transistor MN1 in level-shiner 200 may thus discharge node N1 relatively quickly in response to the input signal transitioning high to VDDL—despite transistors MP3' and MP3" being switched weakly on. But level-shifter 200 does not suffer from timing delays due to the weakness of transistors MP3' and MP3" because of the relative strength of transistor MP3''', which is coupled in parallel to the series stack of transistors MP3' and MP3". The source of transistor MP3''' couples to a power supply node providing VDDH and its drain couples to the source of transistor MP1. A control signal C1 drives the gate of transistor MP3'''. A control circuit 205 discussed further below generates control signal C1 responsive to binary transitions of the input signal such as sensed on nodes N1 and N2. Because transistor MP3''' functions to charge node N1, it is also denoted herein as a pull-up transistor. In contrast, transistors MN1 and MN2 may be denoted as pull-down transistors since they function to discharge nodes N1 and N2, respectively.

Because pull-up transistor MP3''' is relatively strong, control signal C1 is generated by control circuit 205 so that pull-up transistor MP3''' is off when the input signal transitions high to VDDL. In that regard, control signal C1 is a VDDH-domain signal such that pull-up transistor MP3' is fully off when control signal C1 is driven high to VDDH. In this fashion, pull-up transistor MP3''' does not struggle with transistor MN1 when transistor MN1 functions to pull node N1 to ground. Note that transistors MP3' and MP3" are weakly on when the input signal is high and transistor MP3''' is off Transistors MP3' and MP3" function as weak keeper transistors that keep the drain of pull-up transistor MP3''' charged to VDDH. In this fashion, there is no leakage current through pull-up transistor MP3''' when transistor MP3''' is off.

As will be explained further herein, control circuit 205 drives control signal C1 low in response to the input signal transitioning high to VDDL. Pull-up transistor MP3''' then switches on so that it may then quickly charge node N1 to VDDH when cross-coupled transistor MP1 is switched on responsive to a subsequent transition of the input signal low to ground. Cross-coupled transistor MP1 is also relatively strong so that the serial combination or stack of pull-up transistor MP3''' and cross-coupled transistor MP1 can quickly charge node N1 to VDDH. Control circuit 205 also drives control signal C1 high to VDDH responsive to the input signal transitioning low. In this fashion, pull-up transistor MP3''' will be fully off and will not struggle with pull-down transistor MN1 at a subsequent high transition of the input signal.

Transistors MP4', MP4", and MP4''' function analogously. Transistor MP4''' may thus be denoted as a pull-up transistor whereas transistors MP4' and MP4" function as weak keeper transistors. The source of transistor MP4' couples to a power supply node for providing VDDH and its drain couples to a source of transistor MP4". The drain of transistor MP4" couples to a source for cross-coupled transistor MP2. The inverted version of the input signal from the inverter INV drives the gates of keeper transistors MP4' and MP4". When the input signal transitions low such that its inverted version transitions high to VDDL, keeper transistors MP4' and MP4" will be only weakly switched on. The serial combination of keeper transistors MP4' and MP4" is even weaker such that pull-down transistor MN2 can thus quickly discharge node N2 despite relatively-strong cross-coupled transistor MP2 being initially on at the transition of the input signal low since cross-coupled transistor MP2 is starved of charge due to the weakness of keeper transistors MP4' and MP4". Pull-up transistor MP4''' couples in parallel with the serial combination of keeper transistors MP4' and MP4". The source of pull-up transistor MP4''' thus couples to a power supply node providing VDDH whereas its drain couples to the source of cross-coupled transistor MP2. Control circuit 205 generates a control signal C2 that drives the gate of pull-up transistor MP4''' responsive to binary transitions of the input signal such as sensed on nodes N1 and N2.

Pull-up transistor MP4''' is relatively strong in comparison to keeper transistors MP4' and MP4". Thus, control circuit 205 drives control signal C2 high to VDDH responsive to the input signal transitioning high to VDDL to prevent pull-up transistor MP4''' from struggling with pull-down transistor MN2 with regard to an eventual discharge of node N2 in response to a subsequent low transition of the input signal (which charges the inverted input signal to VDDL). While pull-up transistor MP4''' is off, keeper transistors MP4' and MP4" function as a weak keeper device that keeps the drain of pull-up transistor MP4''' charged to VDDH so as to eliminate leakage current across pull-up transistor MP4''' while it is off. Control circuit 205 drives control signal C2 low to switch on pull-up transistor MP4''' in response to the input signal transitioning low so that pull-up transistor MP4''' may assist in rapidly charging node N2 to VDDH when cross-coupled transistor MP2 is switched on at a subsequent high transition of the input signal. Cross-coupled transistor MP2 is also relatively strong so that the serial combination of cross-coupled transistor MP2 and pull-up transistor MP4''' may quickly charge node N2 to VDDH. In this fashion, level-shifter 200 has the advantage of weak PMOS stacks when discharging either of nodes N1 and N2 yet has strong PMOS stacks with regard to charging these nodes.

Figure 3:
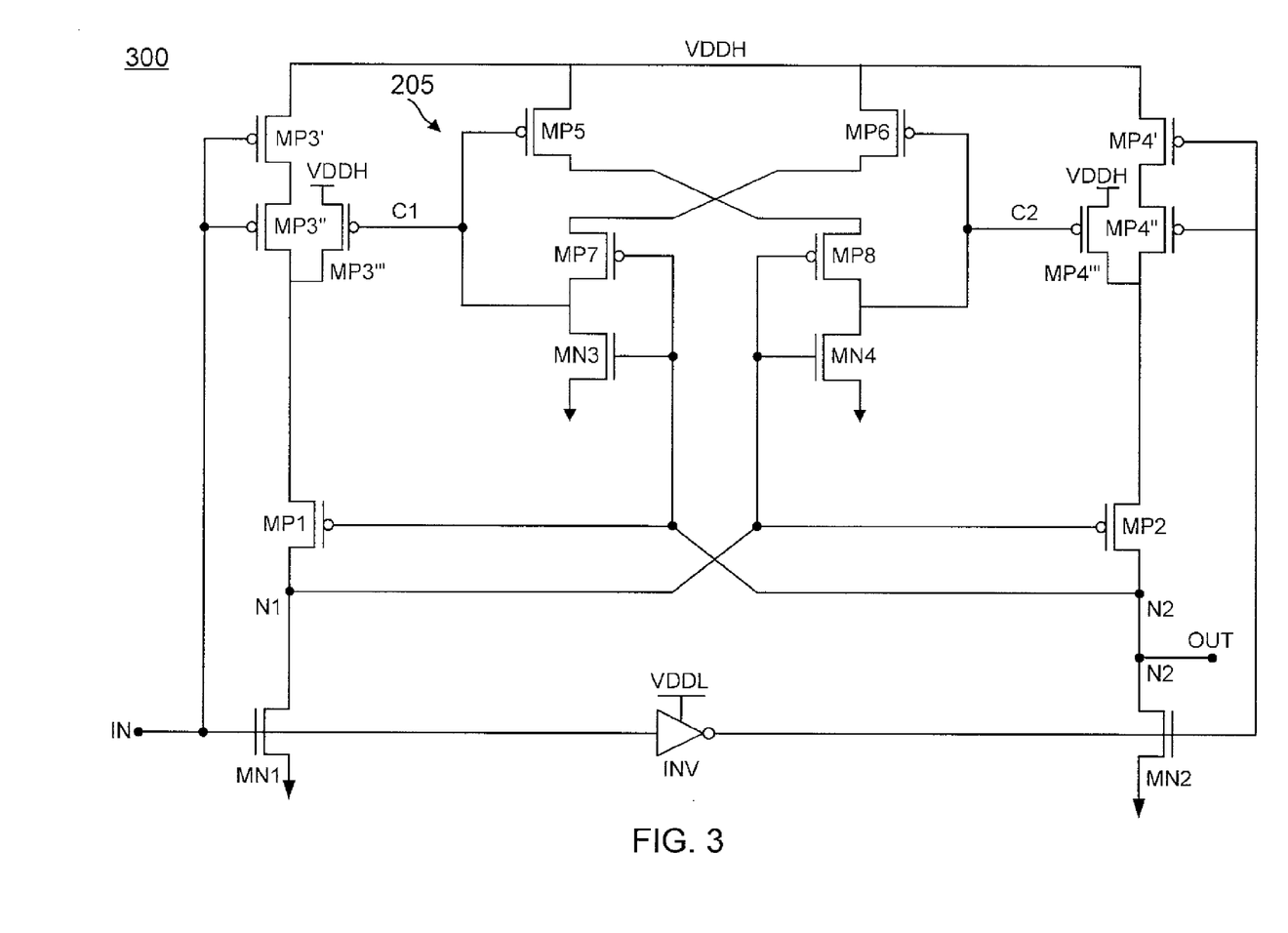
FIG. 3 is a circuit diagram of a wide-range level-shifter in accordance with an embodiment of the disclosure.
Figure 4:
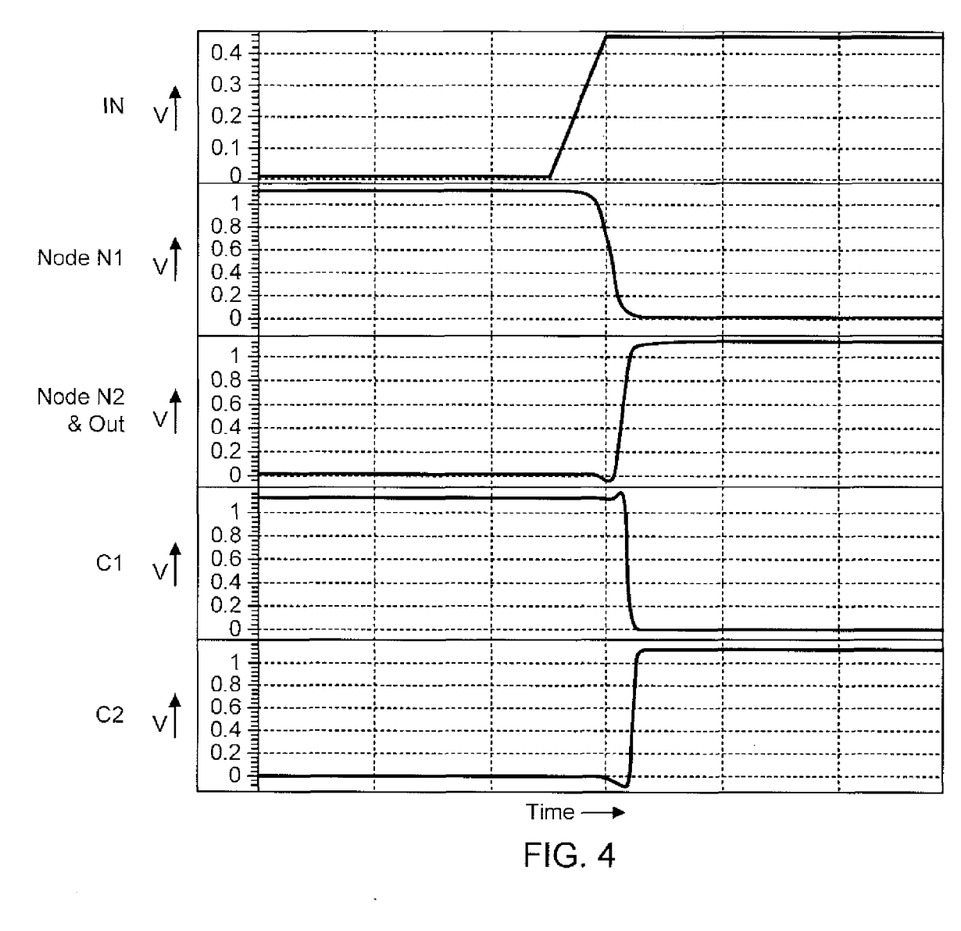
FIG. 4 is a timing diagram for various signals within the level-shifter of FIG. 3 in response to the input signal transitioning from ground to a power supply voltage.
Figure 5:
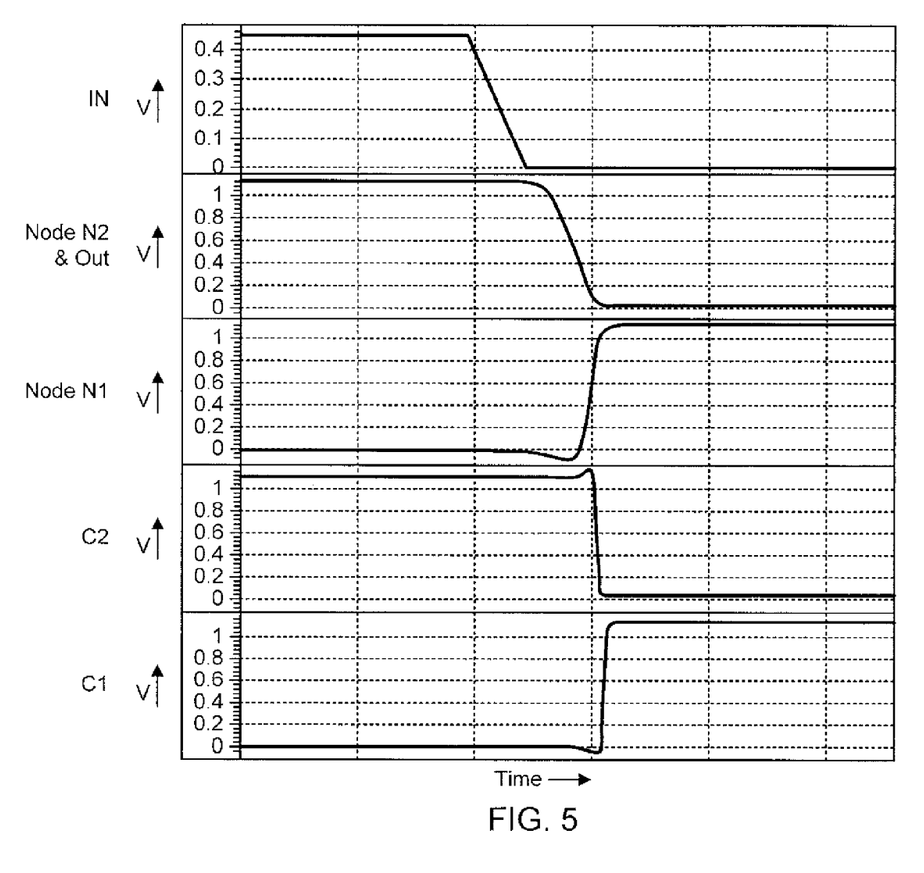
FIG. 5 is a timing diagram for various signals within the level-shifter of FIG. 3 in response to the input signal transitioning from a power supply voltage to ground.

A level-shifter 300 of FIG. 3 shows an example embodiment for control circuit 205. In particular, control circuit 205 comprises PMOS transistors MP5, MP6, MP7, and MP8 as well as NMOS transistors MN3 and MN4. The following discussion will also reference FIGS. 4 and 5. FIG. 4 diagrams the response of node N1, node N2, control signal C1, and control signal C2 in level-shifter 300 for a transition of the input signal from low (VSS) to high (VDDL). Conversely, FIG. 5 illustrates the same signals for level-shifter 300 in response to a transition of the input signal from high to low. The structure of control circuit 205 will first be described followed by a discussion of its function with regard to these binary transitions of the input signal.

Node N1 couples to the gate of transistors MN4 and MP8. The source of transistor MN4 couples to ground and its drain couples to the drain of transistor MP8. The source of transistor MP8 couples to the drain of transistor MP5, which in turn has its source coupled to a power supply node providing VDDH and has its gate driven by control signal C1. The voltage at the drain of transistor MN4 (as well as the drain of transistor MP8) functions as control signal C2 that drives the gates of pull-up transistor MP4''' and transistor MP6. As will be explained further herein, transistor MN4 functions to discharge control signal C2 and thus is also designated herein as a pull-down transistor. Conversely, transistor MP8 functions to charge control signal C2 to VDDH and thus is designated herein as a pull-up transistor.

Transistors MP7 and MN3 have their gates driven by node N2. The source of transistor MN3 couples to ground and its drain couples to the drain of transistor MP7. In turn, the source of transistor MP7 couples to the drain of transistor MP6. The drain voltage for transistors MP7 and MN3 functions as control signal C1, which not only drives the gate of transistor MP5 but also drives the gate of pull-up transistor MP3'''. Analogous to transistor MN4, transistor MN3 is also designated herein as a pull-down transistor in that it functions to discharge control signal C1. Similarly, transistor MP7 is also designated herein as a pull-up transistor in that it functions to charge control signal C1 to VDDH. Transistor MP6 is analogous to transistor MP5 in that transistor MP6 has its source tied to the VDDH power supply node and its gate is driven by control signal C2. Both transistors MP5 and MP6 function as switches that are controlled by control signals C1 and C2, respectively. Node N1 couples to the gate of cross-coupled transistor MP2. Similarly, node N2 couples to the gate of cross-coupled transistor MP1.

Given this structure for control circuit 205, the transition of the input signal from low to VDDL will first be discussed as diagrammed in FIG. 4. Prior to the high transition of the input signal, node N1 would have been charged high to VDDH. This high voltage on node N1 thus switches on pull-down transistor MN4 such that its drain and control signal C2 are grounded prior to the high transition of the input signal. The output signal (which is the same as the node N2 voltage) was low prior to the high transition of the input signal. Thus, pull-up transistor MP7 is on at that time. Since control signal C2 is also low prior to the high transition of the input signal, pull-up transistor MP7 and transistor MP6 are both on while the input signal is low, which charges control signal C1 high. Thus, pull-up transistor MP3''' is off prior to the input signal transitioning to VDDL. Conversely, pull-up transistor MP4''' is on prior to the high transition of the input signal.

When the input signal transitions high, the switching on of pull-down transistor MN1 readily discharges node N1 since pull-up transistor MP3''' is off. Cross-coupled transistor MP2 is then switched on and pull-down transistor MN2 switched off. Since cross-coupled transistor MP2 and pull-up transistor MP4''' are then both switched on, node N2 and the output signal are quickly charged to VDDH as node N1 is discharged. In turn, the charging of node N2 switches on pull-down transistor MN3 and switches off pull-up transistor MP7. Control signal C1 is then discharged in anticipation of a subsequent transition of the input signal low as discussed below with regard to FIG. 5. The discharge of node N1 switches on pull-up transistor MP8 and switches off pull-down transistor MN4. Pull-up transistor MP8 and transistor MP5 are then both conducting such that control signal C2 is driven high to VDDH, which shuts off pull-up transistor MP4'''. In this fashion, pull-up transistor MP4''' won't struggle with pull-down transistor MN2 for a subsequent low transition of the input signal.

When the input signal transitions low as diagrammed in FIG. 5, pull-down transistor MN2 is switched on and pull-down transistor MN1 switched off. Since pull-up transistor MP4''' is off at this time, node N2 is quickly discharged to ground. Cross-coupled transistor MP1 then switches on. Since pull-up transistor MP3''' was on prior to the discharge of node N2, switched-on pull-up transistor MP3''' and cross-coupled transistor MP1 quickly charge node N1 to VDDH. The charging of node N1 switches on pull-down transistor MN4 and switches off pull-up transistor MP8 so that control signal C2 is discharged. Conversely, the discharge of node N2 switches on pull-up transistor MP7 and switches off pull-down transistor MN3. Transistor MP6 is switched on responsive to the discharge of control signal C2 so that the combination of transistor MP6 and pull-up MP7 then charge control signal C1 high to VDDH. The high state of control signal C1 then shuts off pull-up transistor MP3'''.

When the input signal subsequently switches high to VDDL, pull-down transistor MN1 can thus quickly discharge node N1 since this discharge is countered only by the weakly-switched-on combination of keeper transistors MP3' and MP3''. In that regard, transistors MN3, MN4, MP5, MP6, MP7, and MP8 that comprise control circuit 205 are all relatively strong. The discharge of node N1 causes transistors MP2 and MP8 to switch on and also causes transistor MN4 to switch off. Transistors MP5 and MP8 then charge control signal C2 high to VDDH, which shuts off transistors MP4''' and MP6.

After the low transition of the input signal, control circuit 205 thus operates to keep control signals C1 and C2 in their previous state until node N1 is charged and node N2 discharged. Control circuit 205 then responds to the binary transitions of the node N1 and N2 voltages to flip the binary state of the control signals C1 and C2. Control signal C2 is thus discharged so that node N2 can be quickly charged at the subsequent high transition of the input signal. Conversely, control signal C1 is charged to VDDH so that pull-up transistor MP3''' will not struggle with pull-down transistor MN1 when pull-down transistor MN1 discharges node N1 at the subsequent transition of the input signal to VDDH.

Control circuit 205 operates in an analogous fashion during the high transition of the input signal. Control signals C1 and C2 thus are momentarily maintained in their previous state until node N1 is discharged and node N2 is charged. After the discharge of node N1, control circuit 205 charges control signal C2 so that pull-down transistor MP4''' is then turned off. But transistor MP4''' was on long enough after the high transition of the input signal to quickly charge node N2 to VDDH. Control circuit 205 then responds to the charging of node N2 by discharging control signal C1 so that pull-up transistor MP3''' is then turned on so that it may assist in a charging of node N1 responsive to a subsequent low transition of the input signal. But this switching on of pull-up transistor MP3''' occurs after node N1 is already discharged so that there is no struggle with regard to the discharge of node N1. The net result is that level-shifter 300 of FIG. 3 achieves the conflicting goals of having weak PMOS stacks with regard to the discharging of nodes N1 and N2 yet also having strong PMOS stacks with regard to the charging of nodes N1 and N2. In this fashion, level-shifter 300 may have a wide input signal voltage range such that the VDDL may be dropped to low levels (for example, 0.6 V or less) yet high-speed and accurate operation is achieved. Moreover, this performance may be guaranteed across all expected process corners.

Figure 6:
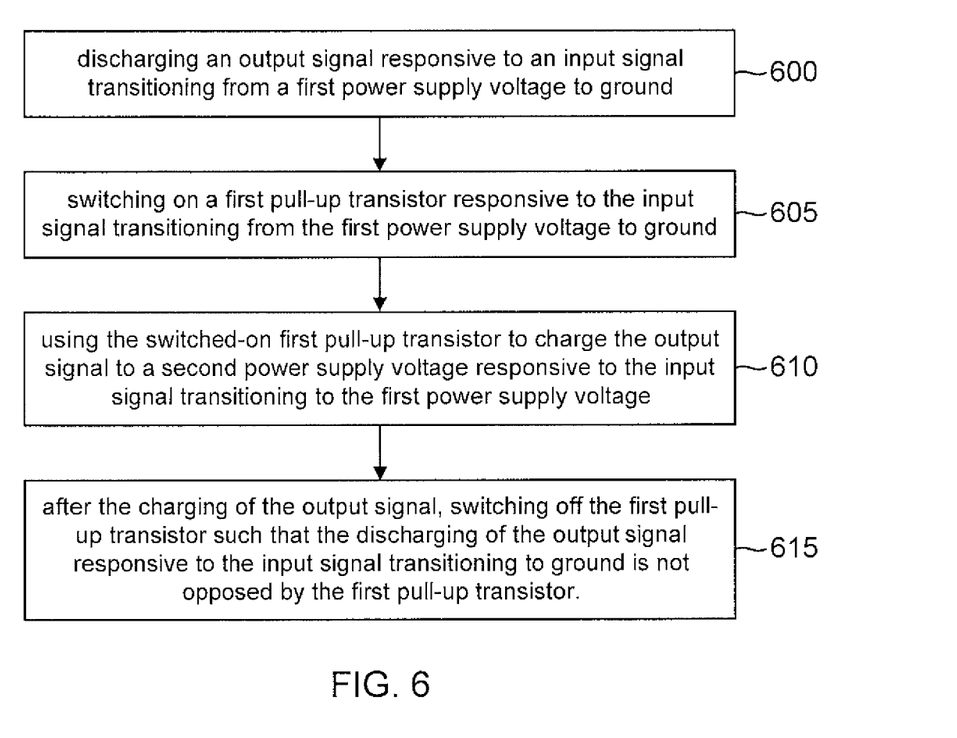
FIG. 6 is a flowchart for a method of operation for the level-shifter of FIG. 2.

A method of operation for level-shifter 300 will now be discussed. FIG. 6 is a flowchart of an example method of operation. A step 600 comprises discharging an output signal responsive to an input signal transitioning from a first power supply voltage to ground. The discharging of the output signal as discussed with regard to FIG. 5 is an example of such an act. A step 605 comprises switching on a first pull-up transistor responsive to the input signal transitioning from the first power supply voltage to ground. The switching on of pull-up transistor MP4''' after the input signal transitions low is an example of such an act. A step 610 comprises using the switched-on first pull-up transistor to charge the output signal to a second power supply voltage responsive to the input signal transitioning from ground to the first power supply voltage. The discussion above with regard to pull-up transistor MP4''' charging the output signal to VDDH (in conjunction with cross-coupled transistor MP2) is an example of such an act. Finally, the method includes a step 615 of after the charging of the output signal, switching off the first pull-up transistor such that the discharging of the output signal responsive to the input signal transitioning to ground is not opposed by the first pull-up transistor. The charging of control signal C2 through pull-up transistor MP8 in response to the discharging of node N1 so as to switch off pull-up transistor MP4''' as discussed with regard to level-shifter 300 is an example of such an act.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A level-shifter, comprising:
   a pair of cross-coupled transistors; wherein a first one of the cross-coupled transistors has a first terminal coupled to a first node and a gate coupled to an output node, and wherein a remaining second one of the cross-coupled transistors has a gate coupled to the first node and a first terminal coupled to the output node;

a first pull-up transistor configured to be responsive to a first control signal to selectively couple a second terminal of the first cross-coupled transistor to a power supply node providing a first power supply voltage;

a second pull-up transistor configured to be responsive to a second control signal to selectively couple a second terminal of the second cross-coupled transistor and the power supply node; and a control circuit configured to control the first control signal and the second control signal to switch on the first pull-up transistor and to switch off the second pull-up transistor responsive to a discharge of the first node and a charge of the output node to the first power supply voltage and to switch on the second pull-up transistor and switch off the first pull-up transistor responsive to a discharge of the output node and a charge of the first node to the first power supply voltage;

a first pull-down transistor having a terminal coupled to the first node, the first pull-down transistor having its gate coupled to an input signal node;

an inverter coupled between the input signal node and an inverted input signal node, the inverter being configured to charge the inverted input signal node to a second power supply voltage responsive to the input signal node being discharged; and a second pull-down transistor coupled to the output node, the second pull-down transistor having its gate coupled to the inverted input signal node, wherein the control circuit includes a third pull-down transistor having its gate coupled to the output node and a terminal coupled to the gate of the first pull-up transistor, the third pull-down transistor being configured to discharge the gate of the first pull-up transistor responsive to the output node being charged to the first power supply voltage.

2. The level-shifter of claim 1, wherein the first power supply voltage is greater than the second power supply voltage.

3. The level-shifter of claim 1, further comprising: a first keeper transistor coupled in parallel with the first pull-up transistor between the second terminal of the first cross-coupled transistor and the power supply node, the first keeper transistor having a gate coupled to the input signal node, wherein the first pull-up transistor is stronger than the first keeper transistor.

4. The level-shifter of claim 3, wherein the first keeper transistor comprises a serially-coupled pair of keeper transistors.

5. The level-shifter of claim 3, wherein the first keeper transistor, the first pull-up transistor, the first cross-coupled transistor, and the second cross-coupled transistor all comprise PMOS transistors, and wherein the first pull-down transistor and the second pull-down transistor both comprise NMOS transistors.

6. The level-shifter of claim 3, further comprising:

a second keeper transistor coupled in parallel with the second pull-up transistor between the second terminal of the second cross-coupled transistor and the power supply node, the second keeper transistor having a gate coupled to the inverted input signal node, wherein the second pull-up transistor is stronger than the second keeper transistor.

7. The level-shifter of claim 6, wherein the second keeper transistor comprises a serially-coupled pair of keeper transistors.

8. The level-shifter of claim 1, wherein the control circuit further comprises:

a third pull-up transistor having its gate coupled to the output node and a first terminal coupled to the terminal of the third pull-down transistor, the third pull-up transistor being configured to charge the gate of the first pull-up transistor to the first power supply voltage responsive to the output node being discharged.

9. The level-shifter of claim 8 wherein the control circuit further comprises:

a fourth pull-down transistor having its gate coupled to the first node and a terminal coupled to the gate of the second pull-up transistor, the fourth pull-down transistor being configured to discharge the gate of the second pull-up transistor responsive to the first node being charged to the first power supply voltage; and a fourth pull-up transistor having its gate coupled to the first node and a first terminal coupled to the terminal of the fourth pull-down transistor, the fourth pull-up transistor being configured to charge the gate of the second pull-up transistor to the first power supply voltage responsive to the first node being discharged.

10. The level-shifter of claim 9, wherein the control circuit further comprises:

a first switch coupled between the power supply node and a second terminal of the third pull-up transistor, the first switch being configured to switch on and off responsive to a voltage for the gate of the second pull-up transistor; and a second switch coupled between the power supply node and a second terminal of the fourth pull-transistor, the second switch being configured to switch on and off responsive to a voltage for the gate of the first pull-up transistor.

11. The level-shifter of claim 10, wherein the first switch and the second switch each comprises a PMOS transistor.

12. A method, comprising:

discharging a first node supplying an output signal responsive to an input signal transitioning from a first power supply voltage to ground, wherein the first node couples to a first terminal of a cross-coupled transistor;

switching on a first pull-up transistor responsive to the input signal transitioning to ground to charge a second terminal of the cross-coupled transistor to a second power supply voltage;

conducting a current through the switched-on first pull-up transistor and the cross-coupled transistor to charge the first node and the output signal to the second power supply voltage responsive to the input signal transitioning to the first power supply voltage; and after the charging of the first node and the output signal, switching off the first pull-up transistor such that the discharging of the first node responsive to the input signal transitioning to ground is not opposed by the first pull-up transistor;

discharging a second node responsive to the input signal transitioning to the first power supply voltage;

switching on a second pull-up transistor responsive to the input signal transitioning to the first power supply voltage;

using the switched-on second pull-up transistor to charge the second node to the second power supply voltage responsive to the input signal transitioning to ground; and after the charging of the second node, switching off the second pull-up transistor such that the discharging of the second node responsive to the input signal transitioning to the first power supply voltage is not opposed by the second pull-up transistor, wherein switching off the first pull-up transistor comprises switching on a third pull-up transistor responsive to the discharging of the second node to charge a control signal driving a gate of the first pull-up transistor.

13. The method of claim 12, wherein discharging the first node and the output signal comprises:
inverting the input signal transitioning from the first power supply voltage to ground into an inverted input signal transitioning from ground to the first power supply voltage; and
responsive to the inverted input signal transitioning to the first power supply voltage, switching on a first pull-down transistor to discharge the first node and the output signal.

14. The method of claim 12, wherein switching on the first pull-up transistor comprises switching on a first pull-down transistor to discharge a control signal driving a gate of the first pull-up transistor, wherein the switching on of the first pull-down transistor is responsive to the charging of the second node.

15. The method of claim 12, wherein switching on the second pull-up transistor comprises switching on a first pull-down transistor responsive to the charging of the first node to discharge a control signal driving a gate of the second pull-up transistor.

16. The method of claim 12, wherein switching off the second pull-up transistor comprises switching on a third pull-up transistor responsive to the discharging of the first node to charge a control signal driving a gate of the second pull-up transistor.

17. A level-shifter, comprising:
a first pull-down transistor having a gate coupled to an input signal node carrying an input signal and a terminal coupled to a first node, the first pull-down transistor being configured to discharge the first node responsive to the input signal transitioning to a first power supply voltage;
a second pull-down transistor having a gate coupled to an inverted input signal node and a terminal coupled to a output node for supplying an output signal, the second pull-down transistor being configured to discharge the output node and the output signal responsive to a voltage for the inverted input signal node transitioning to the first power supply voltage;
a first cross-coupled transistor having a gate coupled to the first node and a first terminal coupled to the output node;
a first pull-up transistor having a first terminal coupled to a second terminal of the first cross-coupled transistor and having a second terminal coupled to a node configured to supply a second power supply voltage that is greater than the first power supply voltage; and
a means for controlling the first pull-up transistor so that the first pull-up transistor is switched on to charge the output node through the first coupled transistor to the second power supply voltage responsive to a charging of the first node to the first power supply voltage and so that the first pull-up transistor is switched off responsive to the discharging of the first node, wherein the first pull-up transistor has a source coupled to a power supply node for supplying the second power supply voltage, the level-shifter further comprising a weak keeper transistor configured to weakly charge a drain of the first pull-up transistor to the second power supply voltage, and wherein the weak keeper transistor comprises a pair of serially-coupled weak keeper PMOS transistors having their gates coupled to the inverted input signal node.

18. The level-shifter of claim 17, further comprising:
a second pull-up transistor; and
a means for controlling the second pull-up transistor so that the second pull-up transistor is switched on to charge the first node to the second power supply voltage responsive to a charging of the output node to the first power supply voltage and so that the first pull-up transistor is switched off responsive to the discharging of the output node.

19. The level-shifter of claim 18, wherein the first pull-down transistor and the second pull-down transistor both comprise NMOS transistors, and wherein the first pull-up transistor and the second pull-up transistor both comprise PMOS transistors.

* * * * *